US012777797B2

(12) United States Patent
Sun et al.

(10) Patent No.: US 12,777,797 B2
(45) Date of Patent: Oct. 27, 2026

(54) ORGANIC LIGHT EMITTING DIODE DISPLAY PANEL AND ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Feixiang Sun, Wuhan (CN); Yi Liu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 358 days.

(21) Appl. No.: 18/569,232

(22) PCT Filed: Jun. 28, 2023

(86) PCT No.: PCT/CN2023/103366
§ 371 (c)(1),
(2) Date: Dec. 12, 2023

(87) PCT Pub. No.: WO2024/103744
PCT Pub. Date: May 23, 2024

(65) Prior Publication Data

US 2025/0089493 A1 Mar. 13, 2025

(30) Foreign Application Priority Data

Nov. 18, 2022 (CN) ......................... 202211449717.5

(51) Int. Cl.
*H10K 59/131* (2023.01)

(52) U.S. Cl.
CPC .................................. *H10K 59/131* (2023.02)

(58) Field of Classification Search
CPC .... H10K 59/131; H10K 59/12; H10K 59/121; H10K 59/124; H10K 59/35; H10K 59/80; H10K 59/88; H10K 59/1213; G09F 9/33
(Continued)

(56) References Cited

U.S. PATENT DOCUMENTS

| | | | | |
|---|---|---|---|---|
| 2021/0375215 A1* | 12/2021 | Cho | ..................... | H10K 59/131 |
| 2022/0102472 A1* | 3/2022 | Huang | ................. | H10K 59/121 |

(Continued)

FOREIGN PATENT DOCUMENTS

| | | |
|---|---|---|
| CN | 114171574 A | 3/2022 |
| CN | 115050340 A | 9/2022 |

(Continued)

OTHER PUBLICATIONS

International Search Report in International application No. PCT/CN2023/103366, mailed on Sep. 7, 2023.

(Continued)

*Primary Examiner* — Moazzam Hossain
(74) *Attorney, Agent, or Firm* — PV IP PC; Christopher S. Ruprecht; Wei Te Chung

(57) ABSTRACT

The present application provides an organic light emitting diode (OLED) display panel and an OLED device. The OLED display panel includes dummy traces disposed on a side of the anode adjacent to the signal traces. At least one of the fanout traces and at least one of the dummy traces are disposed corresponding to a position where the anode is disposed. Each of the fanout traces passing through each of the subpixels and each of the dummy traces passing through each of the subpixels are both symmetrical about a center of the anode of each of the subpixels, so as to improve uniformity of traces in the display area and improve flatness (Continued)

and symmetry of the anode, thereby improving display defect of the display panel.

20 Claims, 12 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2023/0134599 | A1* | 5/2023 | Lai | G02F 1/136286 257/72 |
| 2024/0147785 | A1* | 5/2024 | Wang | G09F 9/33 |

FOREIGN PATENT DOCUMENTS

| | | | |
|---|---|---|---|
| CN | 115347002 | A | 11/2022 |
| CN | 115472657 | A | 12/2022 |
| CN | 115768201 | A | 3/2023 |

OTHER PUBLICATIONS

Written Opinion of the International Search Authority in International application No. PCT/CN2023/103366, mailed on Sep. 7, 2023.

* cited by examiner

ORGANIC LIGHT EMITTING DIODE DISPLAY PANEL AND ORGANIC LIGHT EMITTING DIODE DISPLAY DEVICE

CROSS REFERENCE TO RELATED APPLICATION

This application claims the priority of International Application No. PCT/CN2023/103366, filed on 2023 Jun. 28, which claims priority to Chinese Application No. 202211449717.5, filed on 2022 Nov. 18. The entire disclosures of each of the above applications are incorporated herein by reference.

TECHNICAL FIELD

The present application relates to the field of display technologies, and especially relates to an organic light emitting diode (OLED) display panel and an OLED device.

BACKGROUND

Organic light emitting diode (OLED) display devices are widely used due to their advantages such as self-luminescence, wide color gamut, low power consumption, the capability that flexible display can be achieved, and so on. The OLED display devices in prior art adopt a technology of fanout traces in an active area (FIAA) in order to reduce bezel, that is, the fanout traces are disposed in a display area. However, in the FIAA technology, a density of the traces in the display area is different, thus resulting in poor display in visual effect. In addition, Pol-less Panel (PLP) technology is introduced into the OLED display devices in order to improve light efficiency. However, PLP technology requires better flatness of the display panel, which further aggravates problems of blue and pink deviation, and color separation diffraction in a large viewing angle, thereby resulting in poor display of display panels.

Therefore, the OLED display devices in prior art has a technical problem of poor display caused by different setting densities of traces of FIAA.

SUMMARY

Embodiments of the present application provide an organic light emitting diode (OLED) display panel and an OLED display device, so as to alleviate a technical problem that OLED display devices in prior art have poor display caused by different setting densities of traces in fanout traces in an active area (FIAA).

In order to solve the above problem, the technical scheme provided by the present application is as follows.

Embodiments of the present application provide an organic light emitting diode (OLED) display panel including a display area and a non-display area disposed at a side of the display area. The OLED display panel further includes:

signal traces; and fanout traces disposed on a side of the signal traces and connected to the signal traces.

The OLED display panel further includes a plurality of subpixels. Each of the subpixels includes an anode disposed on a side of the fanout traces away from the signal traces. The fanout traces extend from the non-display area to the display area. The OLED display panel further includes dummy traces disposed on a side of the anode adjacent to the signal traces. The display area includes a first area disposed corresponding to the anode. The first area is provided with at least one of the fanout traces and at least one of the dummy traces. Each of the fanout traces passing through each of the subpixels is symmetrical about a center of the anode of each of the subpixels, and each of the dummy traces passing through each of the subpixels is symmetrical about a center of the anode of each of the subpixels.

In some embodiments, the OLED display panel further includes an upper bezel, a left bezel, a lower bezel, and a right bezel disposed around the display area. Each of the fanout traces includes a first trace portion and a second trace portion, the first trace portion and the second trace portion are connected to each other. The first trace portion is provided along a direction from the left bezel to the right bezel, and the second trace portion is provided along a direction from the lower bezel to the upper bezel. The display area further includes a second area corresponding to a position where the first trace portion is disposed, a third area corresponding to a position where the second trace portion is disposed, and a fourth area where the fanout trace is not disposed.

In some embodiments, at least a part of the dummy traces are disposed in the fourth area, and the dummy traces disposed in the fourth area are disconnected to the fanout traces at connection positions where the fanout traces are connected to the signal traces.

In some embodiments, at least a part of the dummy traces are disposed in at least one of the second area and the third area. Each of the dummy traces disposed in the second area and/or the third area is connected to a corresponding one of the fanout traces adjacent to each of the dummy traces, and each of the dummy traces is spaced from other fanout traces of the fanout traces adjacent to each of the dummy traces.

In some embodiments, lengths of first trace portions decrease along the direction from the lower bezel to the upper bezel, and lengths of second trace portions increase along a direction from the left bezel to a middle area of the display area.

In some embodiments, each of the dummy traces includes a third trace portion and a fourth trace portion. The third trace portion is provided along a same direction as the first trace portion. The fourth trace portion is provided along a same direction as the second trace portion. At least a part of third trace portions are connected to fourth trace portions. Lengths of the third trace portions increase along the direction from the lower bezel to the upper bezel, and lengths of the fourth trace portions decrease along the direction from the left bezel to the middle area of the display area.

In some embodiments, one of the second trace portions adjacent to each other is intersected with corresponding ones of the third trace portions, and other second trace portions of the second trace portions adjacent to each other are spaced from the corresponding ones of the third trace portions.

In some embodiments, one of the second trace portions adjacent to each other is intersected with corresponding ones of the third trace portions, and other second trace portions of the second trace portions adjacent to each other are connected to corresponding ones of other third trace portions along the direction from the left bezel to the right bezel. The third trace portions are disconnected to each other.

In some embodiments, the dummy traces are arranged on a same layer as the fanout traces, and a unit distribution density of the dummy traces is the same as a unit distribution density of the fanout traces.

In some embodiments, the subpixels include red subpixels, blue subpixels, and green subpixels. At least one of corresponding ones of the dummy traces passing through the red subpixels, corresponding ones of the dummy traces passing through the blue subpixels, and corresponding ones of the dummy traces passing through the green subpixels is symmetrical about a center of the anode of the corresponding one of the subpixels.

In some embodiments, the red subpixels include first anodes, and the blue subpixels include second anodes. Each of the corresponding ones of the dummy traces passing through the red subpixels is symmetrical about a center of a corresponding one of the first anodes. Each of the corresponding ones of the dummy traces passing through the blue subpixels is symmetrical about a corresponding one of the second anodes.

In some embodiments, the green subpixels include third anodes. Each of the corresponding ones of the dummy traces passing through the green subpixels is symmetrical about a center of a corresponding one of the third anodes. Each of the corresponding ones of the dummy traces passing through the green subpixels is symmetrical about a center line of a corresponding one of the third anodes along the direction from the lower bezel to the upper bezel.

In some embodiments, along the direction from the left bezel to the right bezel, dummy traces at least partially passing through the green subpixels of adjacent columns extend into the red subpixels, and/or, dummy traces at least partially passing through the green subpixels of adjacent columns extend into the blue subpixels. The dummy traces extending into the red subpixels and/or the blue subpixels are disconnected to the dummy traces passing through the red subpixels and the blue subpixels.

In some embodiments, the OLED display panel further includes a driving circuit layer including a first source-drain layer and a second source-drain layer.

The first source-drain layer includes the signal traces, and the second source-drain layer includes the fanout traces and the dummy traces.

In some embodiments, the OLED display panel further includes a driving circuit layer, the driving circuit layer includes a first source-drain layer, a second source-drain layer, and a third source-drain layer. The first source-drain layer includes a source and a drain. The second source-drain layer includes the signal traces. The third source-drain layer includes the fanout traces and the dummy traces.

In some embodiments, the OLED display panel further includes a first planarization layer and a second planarization layer. The first planarization layer is disposed between the first source-drain layer and the second source-drain layer. The second planarization layer is disposed between the second source-drain layer and the third source-drain layer. The signal traces include data lines. The fanout traces pass through via holes defined in the second planarization layer to be connected to the data lines.

In some embodiments, the OLED display panel further includes a power signal line. The power signal line is disposed at the second source-drain layer, and the dummy traces are connected to the power signal line through a via hole.

Meanwhile, embodiments of the present application further provide an OLED display device including an OLED display panel. The OLED display panel includes a display area and a non-display area disposed at a side of the display area. The OLED display panel further includes:

signal traces; and fanout traces disposed on a side of the signal traces and connected to the signal traces.

The OLED display panel further includes a plurality of subpixels. Each of the subpixels includes an anode disposed on a side of the fanout traces away from the signal traces. The fanout traces extend from the non-display area to the display area. The OLED display panel further includes dummy traces disposed on a side of the anode adjacent to the signal traces. The display area includes a first area disposed corresponding to the anode, The first area is provided with at least one of the fanout traces and at least one of the dummy traces. Each of the fanout traces passing through each of the subpixels is symmetrical about a center of the anode of each of the subpixels, and each of the dummy traces passing through each of the subpixels is symmetrical about a center of the anode of each of the subpixels.

In some embodiments, the OLED display panel further includes an upper bezel, a left bezel, a lower bezel, and a right bezel disposed around the display area. Each of the fanout traces includes a first trace portion and a second trace portion, the first trace portion and the second trace portion are connected to each other. The first trace portion is provided along a direction from the left bezel to the right bezel, and the second trace portion is provided along a direction from the lower bezel to the upper bezel. The display area further includes a second area corresponding to a position where the first trace portion is disposed, a third area corresponding to a position where the second trace portion is disposed, and a fourth area where the fanout trace is not disposed.

In some embodiments, t least a part of the dummy traces are disposed in the fourth area, and the dummy traces disposed in the fourth area are disconnected to the fanout traces at connection positions where the fanout traces are connected to the signal traces.

Beneficial Effects

The present application provides an organic light emitting diode (OLED) display panel and an OLED display device. The OLED display panel includes a display area and a non-display area disposed at a side of the display area. The OLED display panel further includes signal traces and fanout traces disposed on a side of the signal traces and connected to the signal traces. The OLED display panel further includes a plurality of subpixels. Each of the subpixels includes an anode disposed on a side of the fanout traces away from the signal traces. The fanout traces extend from the non-display area to the display area. The OLED display panel further includes dummy traces disposed on a side of the anode adjacent to the signal traces. The display area includes a first area disposed corresponding to the anode. The first area is provided with at least one of the fanout traces and at least one of the dummy traces. Each of the fanout traces passing through each of the subpixels is symmetrical about a center of the anode of each of the subpixels, and each of the dummy traces passing through each of the subpixels is symmetrical about a center of the anode of each of the subpixels. In the present application, the dummy traces are disposed on the side of the anode adjacent to the signal traces, and at least one dummy trace and at least one fanout trace are correspondingly disposed at positions where the anode are disposed. Thus, the dummy traces can fill in areas where the fanout traces are not provided or compensate for areas where the fanout traces are unevenly disposed, so as to improve uniformity of traces in the display area. In addition, each of the fanout traces passing through each of the subpixels and each of the dummy traces passing through each of the subpixels are both symmetrical about a center of the anode of each of the subpixels, so as to improve flatness and symmetry of the anode, thereby improving flatness of luminescent materials. Visual effect at all viewing angles is consistent, thereby improving display defect of the display panel.

BRIEF DESCRIPTION OF THE DRAWINGS

The technical solutions and other beneficial effects of the present application are obvious by detailed description of the specific implementations of the present application in conjunction with the accompanying drawings.

FIG. 4*a* shows a film layer design of a first semiconductor layer, FIG. 4*n* shows a film layer design of an anode layer.

DETAILED DESCRIPTION OF THE EMBODIMENT

The technical solutions in the embodiments of the present application are clearly and completely described below in conjunction with the drawings in the embodiments of the present application. Obviously, the embodiments described are only a part of the embodiments of the present application, rather than all the embodiments. Based on the embodiments in the present application, all other embodiments obtained by those skilled in the art without creative works should be deemed as falling within the claims of the present application.

Figure 1:
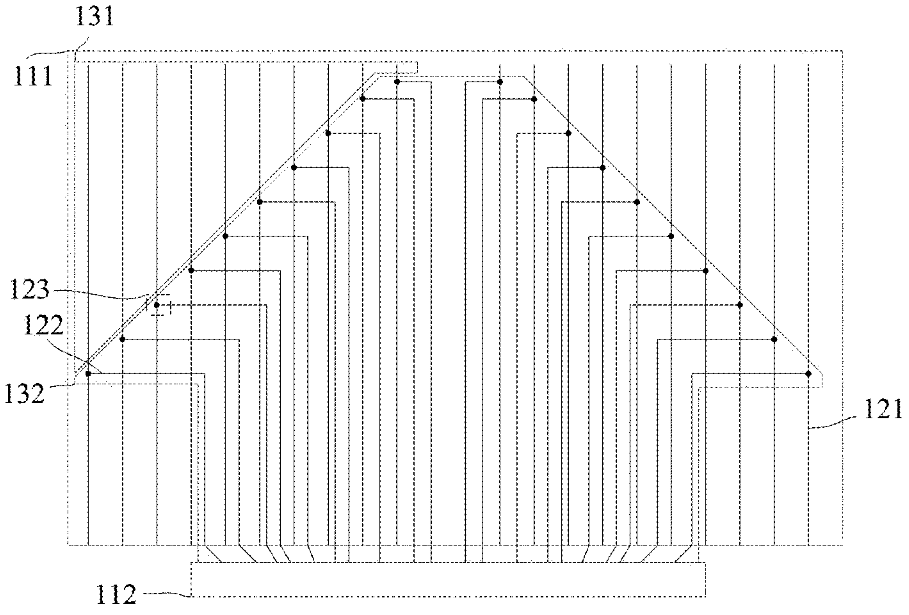
FIG. 1 is a schematic diagram of an organic light emitting diode (OLED) display device in prior art.

As shown in FIG. 1, organic light emitting diode (OLED) display devices adopt a technology of fanout traces in an active area (FIAA) in order to reduce bezel. As can be seen in FIG. 1, in FIAA technology, the fanout traces 122 are disposed in the display area 111, and the fanout traces 122 are connected to data lines 121 in the display area 111. A connection position between the fanout trace 122 and the data line 121 is denoted by a reference number 123. During a process of transmission of signals, normal transmission of the signals is achieved by connecting the fanout traces 122 to the binding terminals in a binding area 112. Since the fanout traces 122 are arranged in the display area 111, and the fanout traces 122 are provided with a separate film layer, the fanout traces 122 can be arranged in a larger space. In a case that the fanout traces are connected to the binding terminals of the binding area 112, lengths of parts of the fanout traces 122 in a non-display area can be less, thereby reducing the bezel. However, it can be seen from FIG. 1 that densities of the fanout traces are different due to different positions of the connection positions between the fanout traces 122 and the data lines 121. Specifically, first, there is no fanout traces in some areas; for example, there is no fanout traces 122 in a first area 131 in FIG. 1. Second, there are fanout traces in some areas, however, the fanout traces are unevenly disposed in horizontal and vertical directions; for example, there are fanout traces 122 in a second area 132 in FIG. 1, but it can be seen that the fanout traces on the right side of the horizontal part of the lowermost fanout traces 122 are arranged along the vertical direction, rather than along the horizontal direction. As a result, parts of the fanout traces in the horizontal and vertical directions are uneven, resulting in poor display in a case that the OLED display panel displays. In addition, with introduction of Pol-less Panel (PLP) technology in OLED display devices, the viewing angle and brightness of the display panel are increased, which further aggravates problems of blue and pink deviation, and color separation diffraction in a large viewing angle, thereby resulting in poor display of the display panel. Therefore, the OLED display devices in prior art has a technical problem of poor display caused by different setting densities of traces of FIAA.

In view of the above technical problems, embodiments of the present application provide an OLED display panel and an OLED display device for alleviating the above technical problems.

Figure 4J:
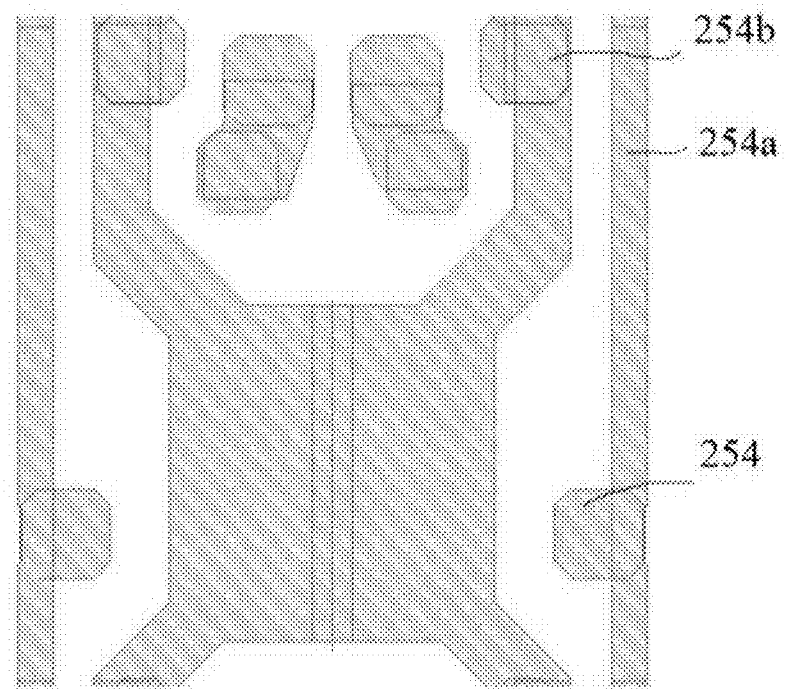
FIG. 4*j* shows a film layer design of a second source-drain layer.
Figure 5:
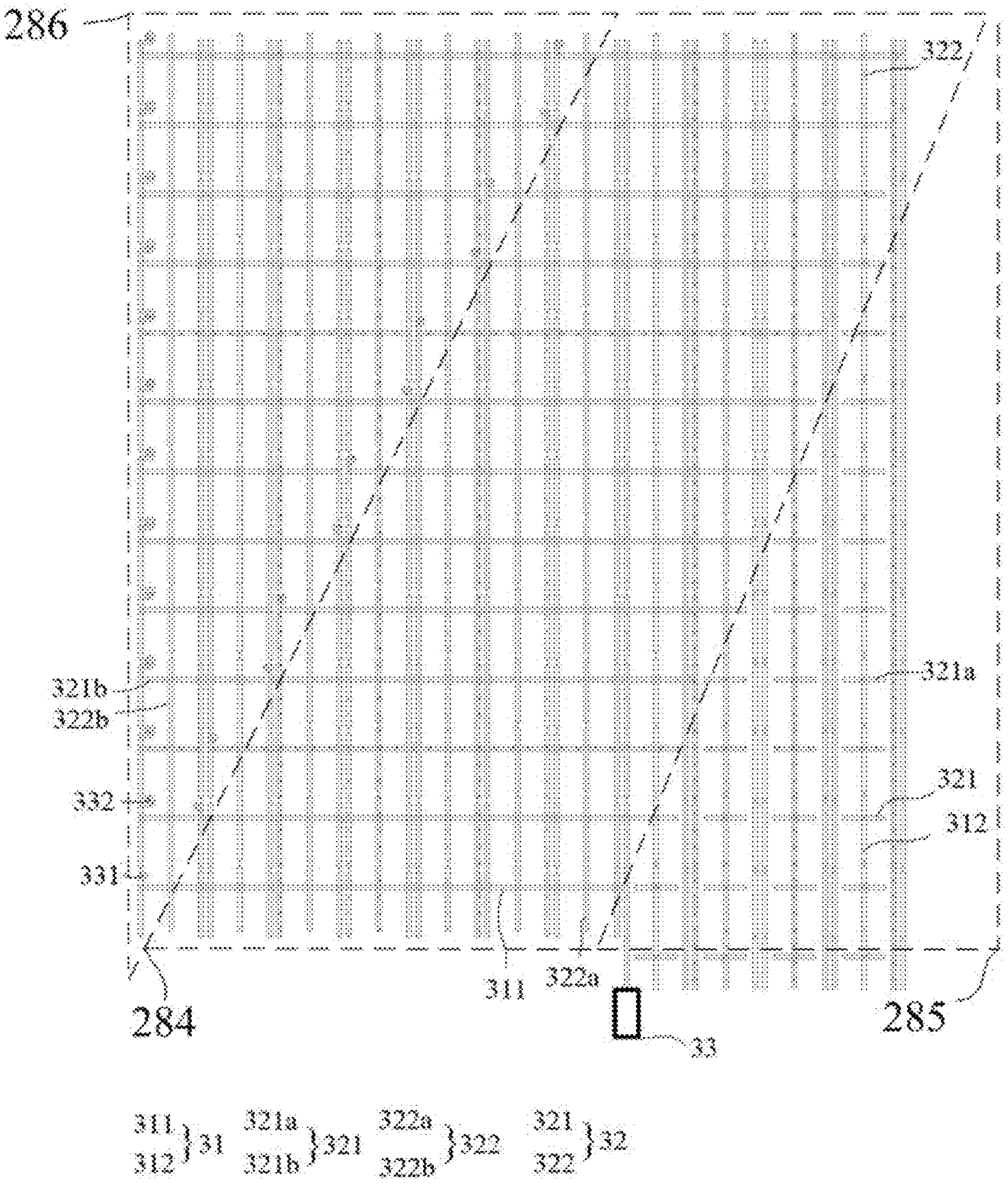
FIG. 5 is a second schematic diagram of an OLED display panel provided by embodiments of the present application.

As shown in FIGS. 2 to 7, embodiments of the present application provide an OLED display panel. The OLED display panel 2 includes a display area 281 and a non-display area 282 disposed at a side of the display area 281. The OLED display panel 2 includes:

signal traces (for example, a data line 254*a* in FIG. 4*j*); and fanout traces 31 disposed on a side of the signal traces, the fanout traces 31 are connected to the signal traces (a connection position between the fanout trace 31 and the signal trace is shown by a reference numeral 331 In FIG. 5).

The OLED display panel 2 further includes a plurality of subpixels 41. Each of the subpixels 41 includes an anode 261*a*. The anode 261*a* is disposed on a side of the fanout traces 31 away from the signal traces. The fanout traces 31 extend from the non-display area 282 to the display area 281. The OLED display panel 2 further includes dummy traces 32, the dummy traces 32 are disposed on a side of the anode 261*a* adjacent to the signal traces. The display area 281 includes a first area 283 disposed corresponding to the anode. The first area 283 is provided with at least one of the fanout traces 31 and at least one of the dummy traces 32. Each of the fanout traces 31 passing through each of the subpixels 41 is symmetrical about a center of the anode 261*a* of each of the subpixels 41, and each of the dummy traces 32 passing through each of the subpixels 41 is symmetrical about a center of the anode 261*a* of each of the subpixels 41.

Embodiments of the present application provide the OLED display panel, in the OLED display panel, the dummy traces are disposed on the side of the anode adjacent to the signal traces, and at least one dummy trace and at least one fanout trace are correspondingly disposed at positions where the anode are disposed. Thus, the dummy traces can fill in areas where the fanout traces are not provided or compensate for areas where the fanout traces are unevenly disposed, so as to improve uniformity of traces in the display area. In addition, each of the fanout traces passing through each of the subpixels and each of the dummy traces passing through each of the subpixels are both symmetrical about a center of the anode of each of the subpixels, so as to improve flatness and symmetry of the anode, thereby improving flatness of luminescent materials. Visual effect at all viewing angles is consistent, thereby improving display defect of the display panel.

Figure 3:
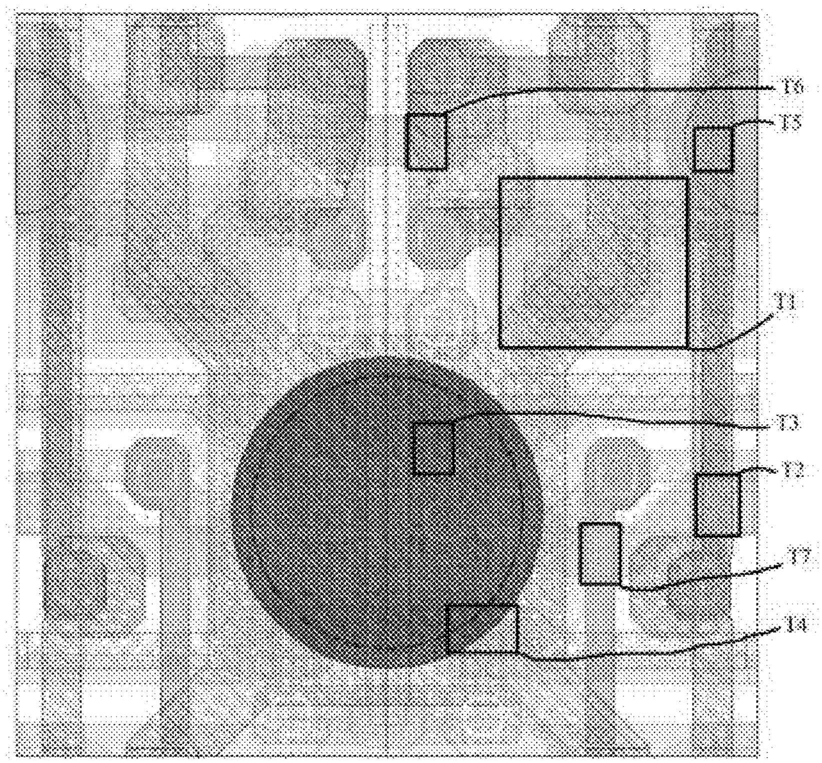
FIG. 3 is a diagram of film layers of a single subpixel in the OLED display panel provided by embodiments of the present application.
Figure 4A:
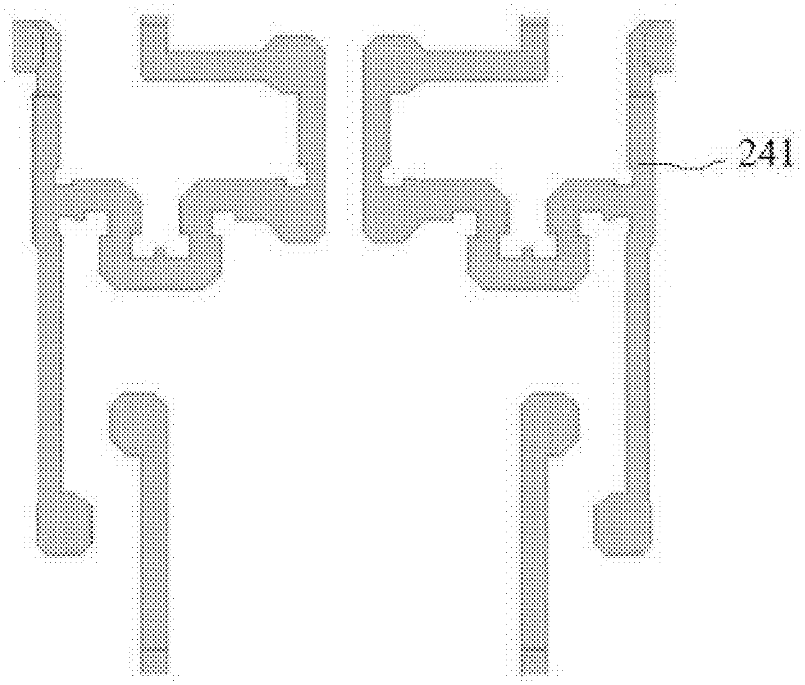
FIG. 4*a* to FIG. 4*n* are exploded diagrams of each of the film layers of the single subpixel in FIG. 3, particularly
Figure 4B:
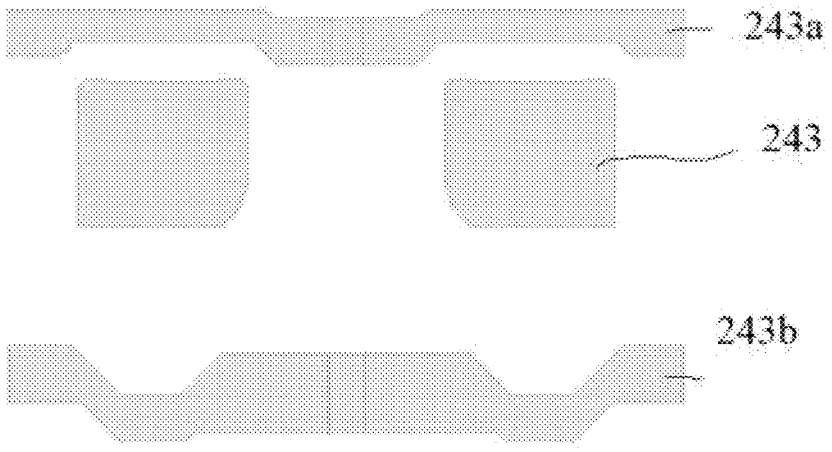
FIG. 4*b* shows a film layer design of a first gate layer.
Figure 4C:
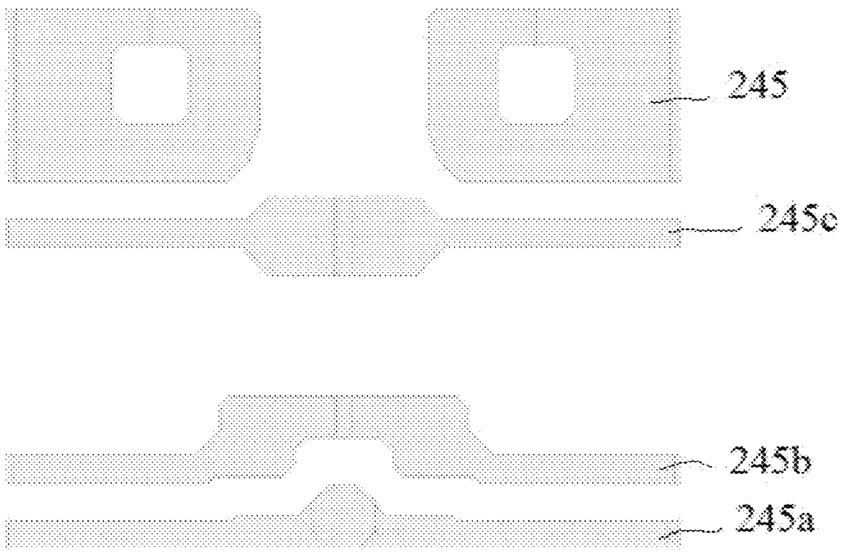
FIG. 4*c* shows a film layer design of a second gate layer.
Figure 4D:
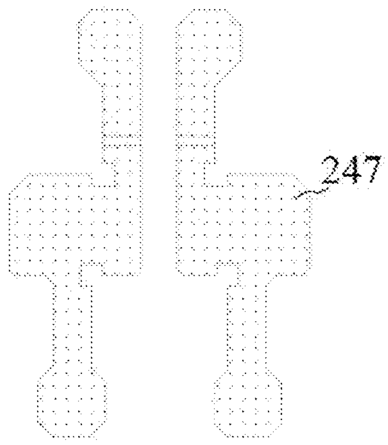
FIG. 4*d* shows a film layer design of a second semiconductor layer.
Figure 4E:
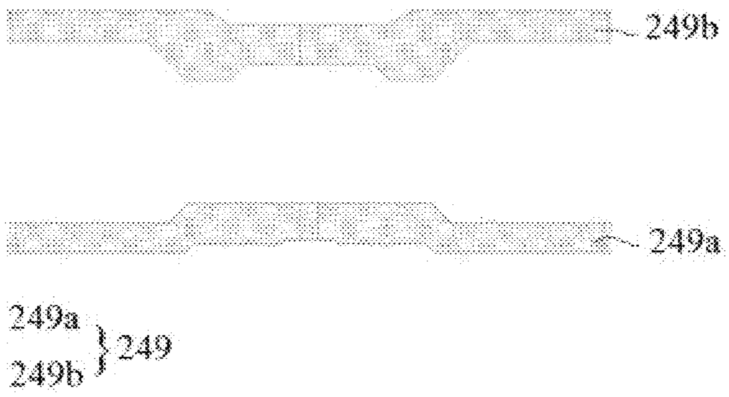
FIG. 4*e* shows a film layer design of a third gate layer.
Figure 4F:
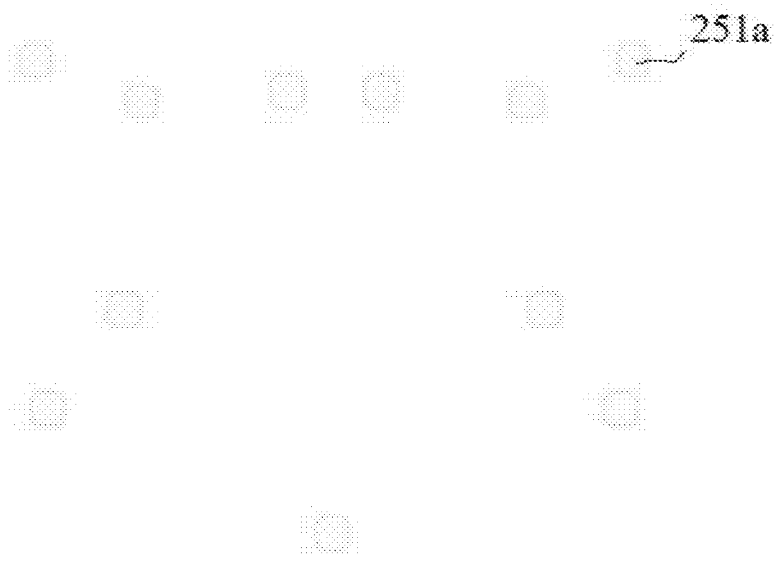
FIG. 4*f* shows a design of via holes connecting a first source-drain layer to the first semiconductor layer.
Figure 4G:
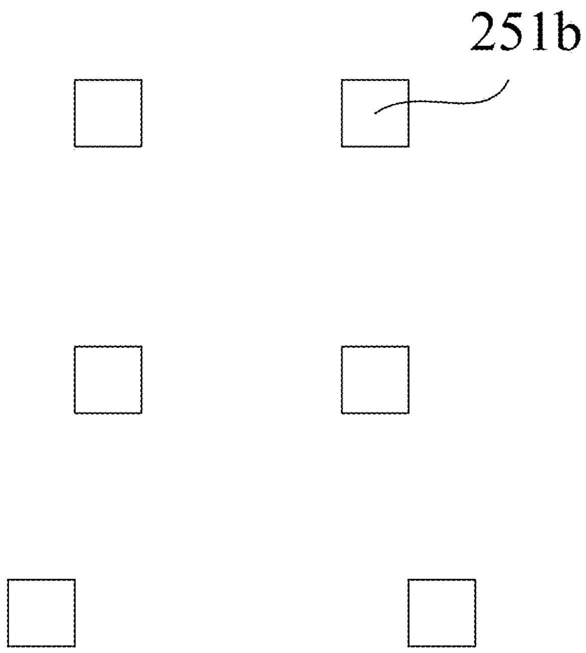
FIG. 4*g* shows a design of via holes connecting the first source-drain layer to the second semiconductor layer.
Figure 4H:
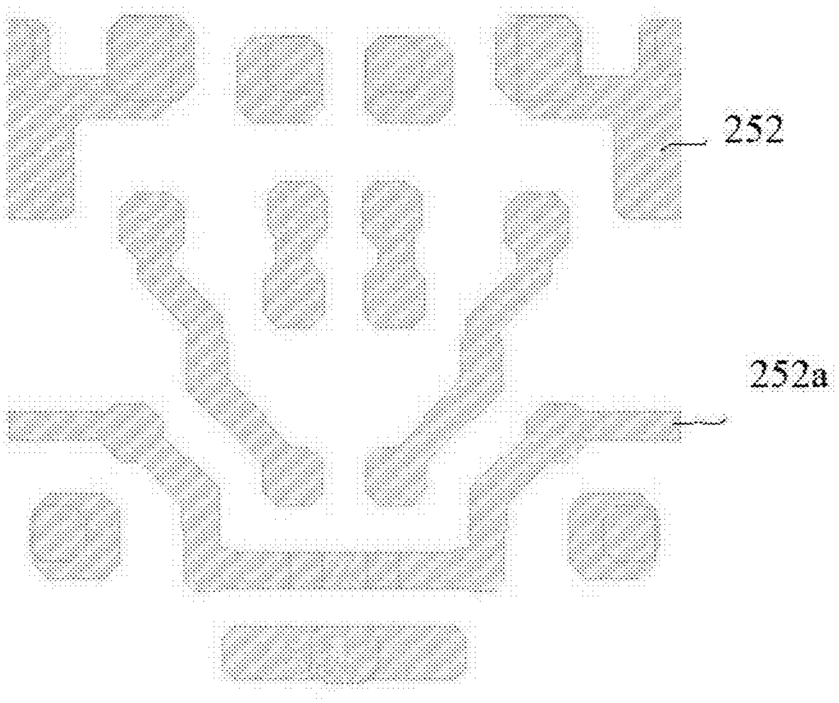
FIG. 4*h* shows a film layer design of the first source-drain layer.
Figure 4I:
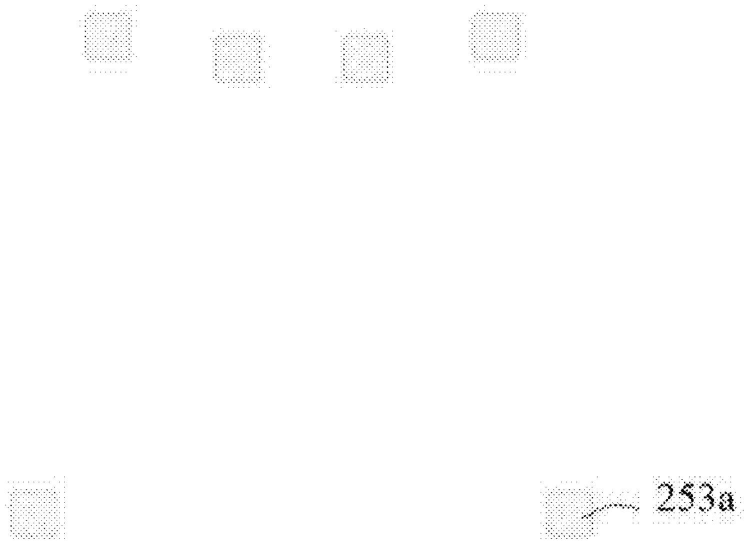
FIG. 4*i* shows a design of via holes defined in a first planarization layer.
Figure 4K:
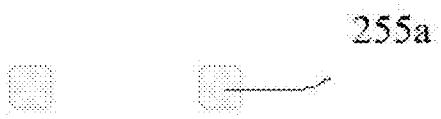
FIG. 4*k* shows a design of via holes defined in a second planarization layer.
Figure 4L:
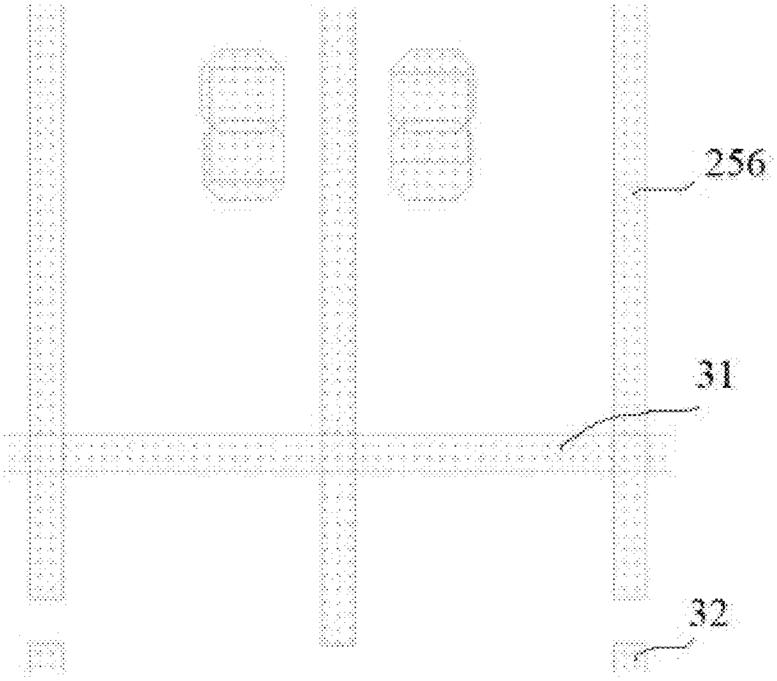
FIG. 4*l* shows a film layer design of a third source-drain layer.
Figure 4M:
FIG. 4*m* shows a design of via holes defined in a third planarization layer.
Figure 4N:
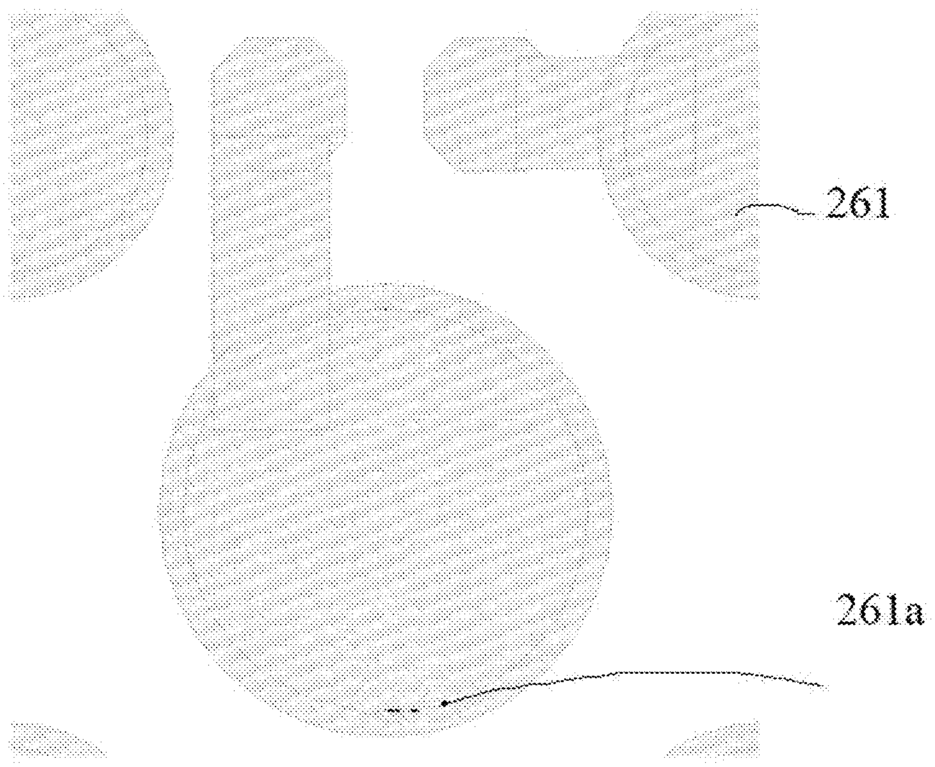

It should be noted that FIG. 3 is a design diagram of film layers at a single subpixel, and FIG. 4*a* to FIG. 4*n* are exploded diagrams of the film layers in FIG. 3. Since there are two circuits symmetrically arranged at the single subpixel, it can be seen that each of the film layers in FIG. 4*a* to FIG. 4*m* is symmetrically arranged. FIG. 4*n* is a diagram of film layer of an anode. The display panel is divided into a left side and a right side with a center line of the display panel as a boundary. FIG. 5 only shows an arrangement of the fanout traces 31 and the dummy traces 32 on the left side. It can be understood that the fanout traces 31 and the dummy traces 32 on the right side are symmetrically arranged with the fanout traces 31 and the dummy traces 32 on the left side.

It should be noted that difference between the fanout trace 31 and the dummy trace 32 is described by taking one binding terminal 33 as an example. The fanout trace 31 refers to a trace continuously connected between the signal trace and the binding terminal 33 (the connection position between the fanout trace 31 and the signal trace is shown by the reference numeral 331). The dummy trace 32 refers to other traces except the fanout traces 31.

It should be noted that since the signal traces and the fanout traces are disposed at different layers, and after the dummy traces are added, it is not convenient to show the signal traces and the fanout traces in a same drawing. Only the connection position between the fanout trace 31 and the signal trace is shown in FIG. 5 by the reference numeral 331. For arrangement modes of the signal traces, please refer to arrangement modes of the data line 254*a* in FIG. 3 to FIG. 4*n*.

In current display devices, an arrangement mode of the fanout traces is shown in FIG. 1. It can be seen that there is no fanout trace in some areas, and an arrangement of the fanout traces in the horizontal and vertical directions is uneven, so that film layers under the anode are uneven, thereby the anode layer is uneven. In a case that luminescent materials are prepared later, the luminescent materials of each subpixel is uneven, thus resulting in poor display. In view of the above technical problems, in the present application, the dummy traces are disposed on the side of the anode adjacent to the signal traces, and at least one dummy trace is arranged in the first area. Thus, the dummy traces of the present application may at least be disposed in an area without the fanout traces (for example, an area with only data lines 121 in FIG. 1), and/or be disposed in an area where the fanout traces are unevenly in the horizontal and vertical directions (for example, for an area with the fanout traces 122 in FIG. 1, other fanout traces 122 disposed on a side of horizontal portions of the fanout traces 122 are disposed vertically rather than horizontally, and other fanout traces 122 disposed on a side of the vertical portions of the fanout traces 122 are arranged horizontally rather than vertically). Thus, unevenness caused by the area without fanout traces and the area with the fanout traces is improved, and/or, unevenness of the fanout traces in horizontal and vertical directions (for example, in FIG. 5, a third trace portion 321 extending along the horizontal direction and a fourth trace portion 322 extending along the vertical direction are provided, so as to make lengths and pitches of the traces in any area where the fanout traces 31 are provided are similar or even equal in the horizontal direction and the vertical direction, so that the traces are evenly arranged in horizontal and vertical directions) is improved. In addition, each of the fanout traces passing through each of the subpixels and each of the dummy traces passing through each of the subpixels are both symmetrical about a center of the anode of each of the subpixels, so as to improve flatness and symmetry of the anode, thereby improving display defect of the display panel.

It should be noted that in FIG. 5, a reference numeral 332 denotes a connection position between the dummy trace 32 and other traces, and a reference numeral 331 denotes a connection position between the fanout trace 31 and the signal trace. The connection position between the dummy trace 32 and other traces, and the connection position between the fanout trace 31 and the signal trace can be distinguished from FIG. 5 by judging whether the connection position is connected to the fanout trace. It can be learned from FIG. 5 that the dummy trace 32 connected to other traces is not connected to the fanout traces 31, and the dummy trace 32 connected to the fanout traces 31 is not connected to adjacent fanout traces 31. The dummy traces 32 are used as traces for planarization, and don't affect signals transmitted by the fanout traces 31.

Figure 6:
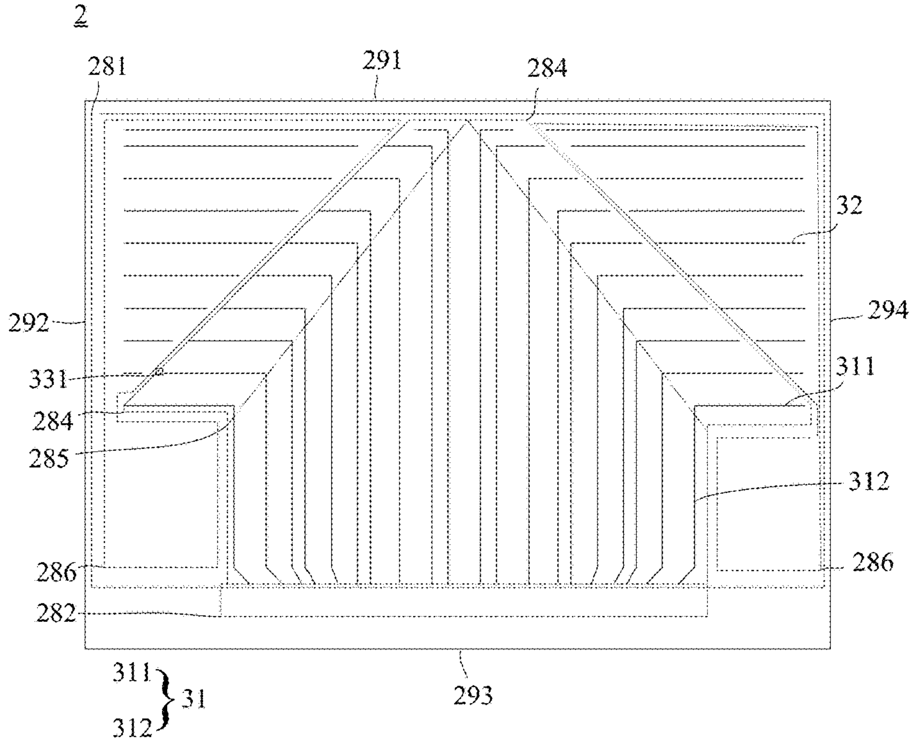
FIG. 6 is a third schematic diagram of an OLED display panel provided by embodiments of the present application.

In one embodiment, as shown in FIG. 6, the OLED display panel 2 further includes an upper bezel 291, a left bezel 292, a lower bezel 293, and a right bezel 294 disposed around the display area 281. Each of the fanout traces 31 includes a first trace portion 311 and a second trace portion 312. The first trace portion 311 and the second trace portion 312 are connected to each other. The first trace portion 311 is provided along a direction from the left bezel 292 to the right bezel 294. The second trace portion 312 is provided along a direction from the lower bezel 293 to the upper bezel 291. The display area 281 further includes a second area 284 corresponding to a position where the first trace portion 311 is disposed, a third area 285 corresponding to a position where the second trace portion 312 is disposed, and a fourth area 286 where the fanout trace 31 is not disposed.

In view of a technical problem that poor flatness of the anode layer caused by providing the fanout traces only in some areas leads to poor display. In one embodiment, as shown in FIG. 6, at least a part of the dummy traces 32 are disposed in the fourth area 286, and the dummy traces 32 disposed in the fourth area 286 are disconnected to the fanout traces 31 at connection positions where the fanout traces 31 are connected to the signal traces. The dummy traces are disposed in the fourth area, the dummy traces fill in areas where the fanout traces are not provided, each area in the display area is provided with the traces to improve uniformity of traces in the display area. In addition, each of the fanout traces passing through each of the subpixels and each of the dummy traces passing through each of the subpixels are both symmetrical about a center of the anode of each of the subpixels, so as to improve flatness and symmetry of the anode, thereby improving flatness of luminescent materials, and improving display defect of the display panel.

It should be noted that, only one connection position between the fanout trace and the signal trace is shown in FIG. 6 for the convenience of viewing. In fact, all the fanout traces are connected to the signal traces, and the connection position between each fanout trace and the signal trace can be seen in FIG. 5.

More specifically, in view of the problem described above, there is no fanout trace in some areas, for example, there is no fanout trace 122 in the first area 131 in FIG. 1. The dummy traces are disposed in the fourth area, as shown in FIG. 6, it can be seen that the dummy trace 32 are arranged outside the connection positions between the fanout traces 31 and the signal traces. The dummy traces can be arranged in a same film layer as the fanout traces, so that uniformity of the film layer provided with the fanout traces can be improved, thereby improving flatness of the anode layer and improving display effect of the display panel.

In view of a technical problem that poor flatness of the anode layer caused by uneven arrangement of the fanout traces leads to poor display. In one embodiment, as shown in FIG. 5, at least a part of the dummy traces 32 are disposed in at least one of the second area 284 and the third area 285, each of the dummy traces 32 disposed in the second area 284 and/or the third area 285 is connected to a corresponding one of the fanout traces 31 adjacent to each of the dummy traces, and each of the dummy traces 32 is spaced from other fanout traces 31 of the fanout traces 31 adjacent to each of the dummy traces. The dummy traces are disposed in at least one of the second area and the third area, positions only provided with vertical traces or horizontal traces of the fanout traces are filled, so that an arrangement density of traces in each area of the display panel is similar or even equal. In addition, the dummy traces can be arranged in a same film layer of the fanout traces or be arranged in other film layers, so that uniformity of the film layers under the anode is improved, thereby improving flatness of the anode layer, and improving display effect of the display panel. Moreover, each of the dummy trace is connected to one of the fanout traces adjacent to each of the dummy traces, each of the dummy traces is spaced from other fanout traces of the fanout traces adjacent to each of the dummy traces, so as to avoid it that adjacent fanout traces are connected by the dummy trace, so that the fanout traces can normally transmit signals to the signal traces.

Specifically, in view of the above problem that some areas are provided with the fanout traces, and the fanout traces are not uniformly arranged in horizontal and vertical directions. As shown in FIG. 5, in the present application, the dummy traces 32 are disposed in the second area 284 and the third area 285, for example, the dummy traces 32 may be provided on a right side of horizontal portions of the lowermost fanout traces 31, so as to improve uniformity of the fanout traces 31 in horizontal direction. As can be seen from FIG. 5, the third trace portion 321 is connected to one fanout trace 31, and there is a distance between the third trace portion 321 and another fanout traces 31 adjacent to the one fanout trace 31, so as to prevent it that adjacent fanout traces are connected by the third trace portion 321, so that the fanout traces normally transmit signals.

It should be noted that the length of the first trace portion refers to a distance between a left end of the first trace portion and a right end of the first trace portion, the length of the second trace portion refers to a distance between an upper end of the second trace portion and a lower end of the second trace portion. Similarly, the length of the third trace portion refers to a distance between a left end of the third trace portion and a right end of the third trace portion, and the length of the fourth trace portion refers to a distance between an upper end of the fourth trace portion and a lower end of the second trace portion. Since the third trace portion and the fourth trace portion may be disconnected, the length of the third trace portion and the length of the fourth trace portion may be a sum of lengths of the disconnected portions.

In one embodiment, as shown in FIGS. 5 and 6, lengths of the first trace portions 311 decrease along the direction from the lower bezel 293 to the upper bezel 291. Lengths of the second trace portions 312 increase along a direction from the left bezel to a middle area of the display area.

The embodiments of the present application aims at a problem that some areas are provided with the fanout traces, and the fanout traces are not uniformly arranged in horizontal and vertical directions. Specifically, the fanout trace include the first trace portion and the second trace portion, and the first trace portion in the horizontal direction and the second trace portion in the vertical direction are arranged unevenly. In the embodiments of the present application, the dummy trace include the third trace portion and the fourth trace portion. The third trace portion and the fourth trace portion are arranged according to arrangement directions and arrangement density of the first trace portion and the second trace portion. The dummy traces may be arranged in a same film layer of the fanout traces, so as to improve uniformity of the film layer in which the fanout traces are disposed and improve flatness of the film layer in which the fanout traces are disposed, thereby improving flatness of the anode layer. In addition, each of the fanout traces passing through each of the subpixels and each of the dummy traces passing through each of the subpixels are both symmetrical about a center of the anode of each of the subpixels, so as to improve symmetry of the anode, so that visual effect at all viewing angles is consistent, thereby improving display defect of the display panel.

In view of a technical problem of poor flatness caused by uneven arrangement of the fanout traces and the dummy traces, in one embodiment, as shown in FIGS. 5 and 6, each of the dummy traces 32 includes a third trace portion 321 and a fourth trace portion 322. The third trace portion 321 is provided along a same direction as the first trace portion 311. The fourth trace portion 322 is provided along a same direction as the second trace portion 312. At least a part of third trace portions 321 are connected to fourth trace portions 322. Lengths of the third trace portions 321 increase along the direction from the lower bezel 293 to the upper bezel 291. Lengths of the fourth trace portions decrease along the direction from the left bezel to the middle area of the display area. Widths of the third trace portions increase from bottom to top, so that a variation trend of the widths of the third trace portions is opposite to a variation trend of the widths of the first trace portions. The third trace portions can fill a free area of the first trace portions, so as to improve uniformity of horizontal portions of the film layer where the fanout traces are disposed. Widths of the fourth trace portions are reduced from left to right, so that a variation trend of the widths of the fourth trace portions tends to be opposite to a variation trend of the widths of the second trace portions. The fourth trace portions can fill a free area of the second trace portions, so as to improve uniformity of vertical portions of the film layer where the fanout traces are disposed. Flatness of the anode layer is improved, thereby improving display effect of the display panel.

Specifically, the first trace portion and the second trace portion can be arranged at a preset angle. The preset angle is determined according to the actual design of the fanout traces. The preset angle may range from 0 degree to 180 degree, and exclude 0 degrees. For example, the first trace portion and the second trace portion are arranged horizontally and longitudinally, respectively, and an angle between the the first trace portion and the second trace portion is 90 degree.

The embodiments are described in detail by taking increasement in the lengths of the third trace portions and decreasement in the lengths of the fourth trace portions as an example. However, the embodiments of the present application are not limited thereto, for example, the lengths of the third trace portion are equal, and the lengths of the fourth trace portions are equal.

Specifically, in view of the problem that the first trace portion disposed along the horizontal direction and the second trace portion disposed along the vertical direction are not uniformly arranged. As shown in FIG. 5, the third trace portion 321 includes a first subportion 321*a* and a second subportion 321*b*. The first subportion 321*a* is intersected with the second trace portion 312. The first subportion 321*a* is connected to one of the second trace portions 312 adjacent to the first subportion 321*a*, and there are spaces between the first subportion 321*a* and other second trace portions 312 of the second trace portions 312 adjacent to the first subportion 321. The fourth trace portion 322 includes a third subportion 322*a* and a fourth subportion 322*b*. The third subportion 322*a* is connected to one of the first trace portions 311 adjacent to the third subportion, and there are spaces between the third subportion 322*a* and other first trace portions 311 of the first trace portions 311 adjacent to the third subportion. The second subportion 321*b* is intersected with the fourth subportion 322*b*. The third trace portions 321 are intersected with the second trace portions 312 and the fourth trace portions 322, respectively; and the fourth trace portion 322 are intersected with the first trace portion 311 and the third trace portion 321, respectively; so that the third trace portions and the fourth trace portions compensate an area in which the first trace portions and the second trace portions are not uniformly arranged. Thus, any part of the film layer in which the fanout traces are disposed includes traces disposed along the horizontal direction and traces disposed along the vertical direction, flatness of the film layer in which the fanout traces are disposed is improved. In addition, the widths of the third trace portions and the fourth trace portions may be controlled to improve flatness of the film layer in which the fanout traces are disposed, so that flatness of the anode layer is improved, thereby the improving display effect of the display panel.

In one embodiment, as shown in FIG. 5, one second trace portion 312 of the second trace portions 312 adjacent to each other is intersected with corresponding ones of the third trace portions 321, and other second trace portions 312 of the second trace portions 312 adjacent to each other are spaced from the corresponding ones of the third trace portions 321. One of the second trace portions adjacent to each other is intersected with corresponding ones of the third trace portions, and other second trace portions of the second trace portions adjacent to each other are spaced from the corresponding ones of the third trace portions. Each of the fanout traces passing through each of the subpixels and each of the dummy traces passing through each of the subpixels are both symmetrical about a center of the anode of each of the subpixels. Thus, the third trace portions connected to the second trace portions may be uniformly arranged, so as to improve flatness of the film layer in which the fanout traces are disposed, thereby improving flatness and symmetry of the anode layer and improving display effect of the display panel.

Specifically, in a case the third trace portion and the second trace portion are intersected, the third trace portion may be symmetrically arranged about the second trace portion, so as to further improve flatness and symmetry of the film layer in which the fanout traces are disposed, thereby improving a problem of poor display such as different visual effects at large viewing angles and color separation diffraction caused by poor flatness and symmetry of the anode layer.

Figure 8:
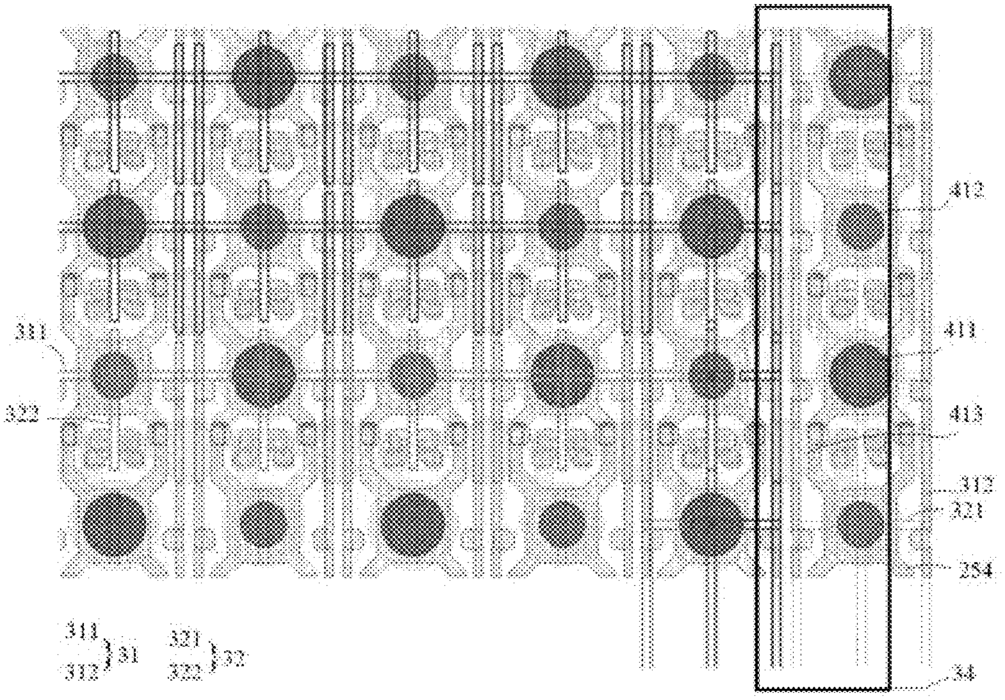
FIG. 8 is a fifth schematic diagram of an OLED display panel provided by embodiments of the present application.

In one embodiment, as shown in FIG. 8, one second trace portion 321 of the second trace portions 312 adjacent to each other is intersected with corresponding ones of the third trace portions 321, and other second trace portions 312 of the second trace portions 312 adjacent to each other are connected to corresponding ones of other third trace portions 321 along the direction from the left bezel to the right bezel. The third trace portions 321 are disconnected to each other. One of the second trace portions adjacent to each other is intersected with the corresponding ones of the third trace portions, and other second trace portions of the second trace portions adjacent to each other are connected to the corresponding ones of other third trace portions, so as to improve uniformity of impedance of each second trace portion, thereby improving poor display caused by the inconsistency of impedance of each fanout trace.

In view of a technical problem that poor flatness of the anode layer caused by different distribution density of the fanout traces leads to poor display. In one embodiment, as shown in FIGS. 4*l* and 5, the dummy traces 32 are arranged on a same layer as the fanout traces 31. A unit distribution density of the dummy traces 32 is the same as a unit distribution density of the fanout traces 31. The dummy traces are arranged on the same layer as the fanout traces, so as to improve uniformity and flatness of the film layer in which the fanout traces are disposed, thus improving flatness of the anode layer. In addition, the unit distribution density of the dummy traces is the same as the unit distribution density of the fanout traces, so as to further improve uniformity of the film layer in which the fanout traces are disposed, thus improving flatness of the anode layer and improving display effect of the display panel.

Specifically, the unit distribution density refers to the density of traces disposed in per unit area. For example, there are the fanout traces of 0.5 square millimeter within 1 square millimeter, so that the unit distribution density of the fanout traces is 0.5.

Considering it that the dummy traces are disconnected to each other, so that the unit distribution density of the dummy traces is slightly less than the unit distribution density the fanout traces. Therefore, a difference between the unit distribution density of the dummy traces and the unit distribution density of the fanout traces can be made less than a value. The value can be determined according to flatness of the anode layer and is specifically limited.

Figure 7:
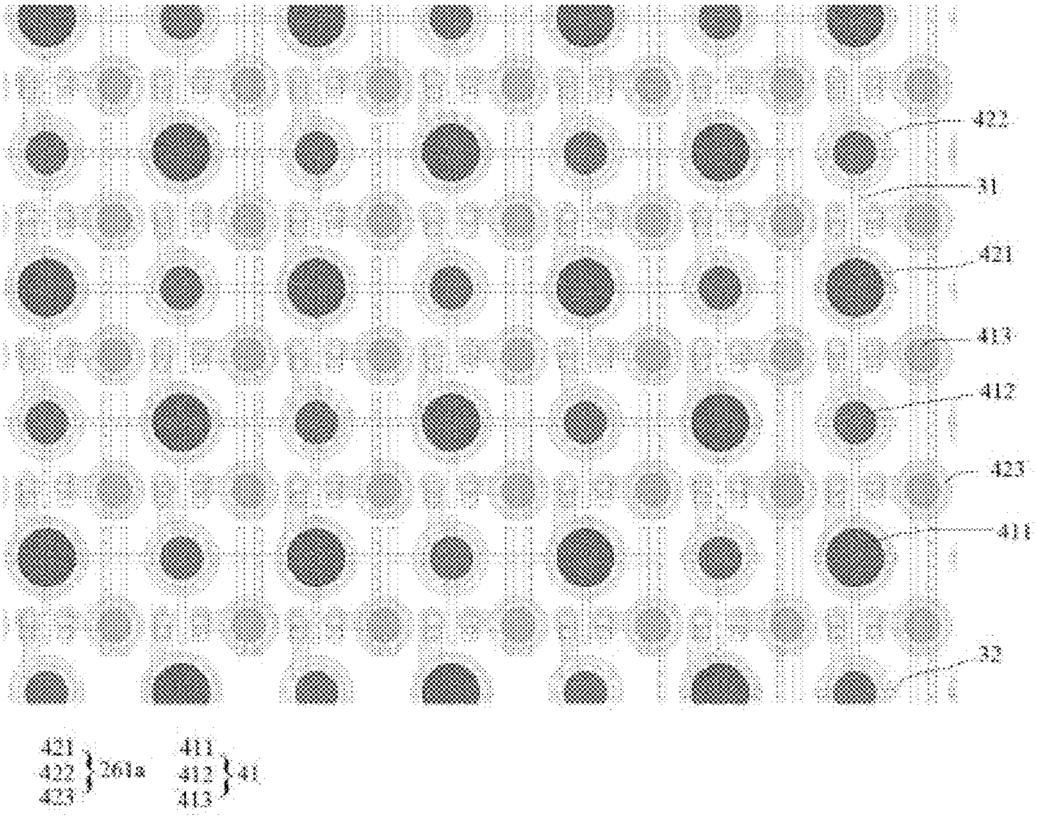
FIG. 7 is a fourth schematic diagram of an OLED display panel provided by embodiments of the present application.

In view of a technical problem that poor flatness of the anode layer caused by uneven distribution position of the fanout traces leads to poor display. In one embodiment, as shown in FIG. 7, the subpixels 41 include red subpixels 412, blue subpixels 411, and green subpixels 413. At least one of corresponding ones of the dummy traces 32 passing through the red subpixels 412, corresponding ones of the dummy traces 32 passing through the blue subpixels 411, and corresponding ones of the dummy traces 32 passing through the green subpixels 413 is symmetrical about a center of the anode of the corresponding one of the subpixels 41. At least one of corresponding ones of the dummy traces passing through the red subpixels, corresponding ones of the dummy traces passing through the blue subpixels, and corresponding ones of the dummy traces passing through the green subpixels is symmetrical about a center of the anode of the corresponding one of the subpixels, so that flatness and symmetry of the anode layer are better. In a case that the luminescent material is disposed on the anode layer, the luminescent materials can be relatively flat, thereby enabling the OLED display panel to display normally and improving the technical problem of poor display of the OLED display panel. Specifically, the subpixel is shown in FIG. 7. However, it can be understood that the subpixel is a virtual concept and does not belong to a structure in the OLED display panel. The embodiments of the present application is only for convenience of describing the arrangement modes of the dummy traces.

In one embodiment, as shown in FIG. 7, the red subpixels 412 include first anodes 422. The blue subpixels 411 include second anodes 421. Each of the corresponding ones of the dummy traces 32 passing through the red subpixels 412 is symmetrical about a center of a corresponding one of the first anodes 422. Each of the corresponding ones of the dummy traces 32 passing through the blue subpixels 411 is symmetrical about a corresponding one of the second anodes 421. Each of the corresponding ones of the dummy traces passing through the red subpixels is symmetrical about a center of a corresponding one of the first anodes. Each of the corresponding ones of the dummy traces passing through the blue subpixels is symmetrical about a corresponding one of the second anodes. The anode layer is symmetrically arranged about the dummy traces, so that flatness and symmetry of the anode layer are better. In a case that the luminescent material is disposed on the anode layer, the luminescent materials can be relatively flat, thereby enabling the OLED display panel to display normally and improving the technical problem of poor display of the OLED display panel.

In one embodiment, as shown in FIG. 7, the green subpixels 413 include third anodes 423. Each of the corresponding ones of the dummy traces 32 passing through the green subpixels 413 is symmetrical about a center of a corresponding one of the third anodes 423. Each of the corresponding ones of the dummy traces 32 passing through the green subpixels 413 is symmetrical about a center line of a corresponding one of the third anodes 423 along the direction from the lower bezel to the upper bezel. In view of a fact that the fanout trace is symmetrically arranged about the center line of the green subpixel, the dummy trace is symmetrical about the center line of the green subpixel in the present application, the fanout traces and the dummy traces are both symmetrically arranged, so that flatness of the film layer in which the fanout traces are disposed can be improved. Flatness and symmetry of the anode layer are improved, thereby improving the technical problem of poor display of the OLED display panel.

Specifically, the red subpixel and the blue subpixel are disposed in a same row, and each of the green subpixels is disposed between adjacent red subpixels. As shown in FIG. 8, the fanout traces 31 and the dummy traces 32 are arranged in the horizontal direction in such a manner that three traces are arranged as a repeating unit 34. One of repeating unit 34 is arranged passing through the red subpixel or the blue subpixel, and two other traces of the repeating unit 34 are arranged between the blue subpixel and the red subpixel.

In one embodiment, as shown in FIG. 8, along the direction from the left bezel to the right bezel, dummy traces 32 at least partially passing through the green subpixels 413 of adjacent columns extend into the red subpixels 412, and/or, dummy traces 32 at least partially passing through the green subpixels 413 of adjacent columns extend into the blue subpixels 411. The dummy traces 32 extending into the red subpixels 412 and/or the blue subpixels 411 are disconnected to the dummy traces 32 passing through the red subpixels 412 and the blue subpixels 411. Dummy traces passing through the green subpixels of adjacent columns extend into the red subpixel and/or the blue subpixel, so as to improve uniformity of impedance of each second trace portion, thereby improving poor display caused by inconsistency of impedance of each fanout trace. In addition, the dummy traces extending into the red subpixels and/or the blue subpixels are disconnected to the dummy traces passing through the red subpixels and the blue subpixels, so as to avoid it that adjacent fanout traces are connected by the dummy trace, so that the fanout traces can work normally.

In the above embodiments, the arrangement mode of the dummy traces is described in detail by taking a design of a pixel as an example, but the embodiments of the present application are not limited thereto. for example, each of the corresponding ones of the dummy traces passing through the green subpixels is symmetrical about a center of the corresponding one of the third anodes. Along the direction from the lower bezel to the upper bezel, each of the corresponding ones of the dummy traces passing through the blue subpixels is symmetrical about the corresponding one of the second anodes, and each of the corresponding ones of the dummy traces passing through the red subpixels is symmetrical about a center of a corresponding one of the first anodes. In one embodiment, the OLED display panel includes a driving circuit layer. The driving circuit layer includes a first source-drain layer and a second source-drain layer.

The first source-drain layer is formed with the signal traces, and the second source-drain layer includes the fanout traces and the dummy traces. In a case that the signal traces, the fanout traces, and the dummy traces are provided, the signal traces may be provided in the first source-drain layer, and the fanout traces may be provided in the second source-drain layer, so that the fanout traces may be provided in the display area, thereby bezel occupied by the fanout traces can be reduced. In addition, the dummy traces are disposed in the second source-drain layer, so that the dummy traces can planarize a film layer in which the fanout traces are disposed, thereby improving flatness of the second source-drain layer, improving flatness of the anode layer, and improving the display effect of the display panel.

In one embodiment, as shown in FIG. 2 to FIG. 4*n*, the OLED display panel 2 further includes a driving circuit layer. The driving circuit layer includes a first source-drain layer 252, a second source-drain layer 254, and a third source-drain layer 256. The first source-drain layer 252 includes a source and a drain. The second source-drain layer 254 includes the signal traces (for example, data lines 254*a*). The third source-drain layer 256 includes the fanout traces 31 and the dummy traces 32. In a case that the signal traces, the fanout traces, and the dummy traces are provided, the signal traces may be provided in the second source-drain layer, and the fanout traces may be provided in the third source-drain layer, so that the fanout traces may be provided in the display area, thereby bezel occupied by the fanout traces can be reduced. In addition, the dummy traces are disposed in the third source-drain layer, so that the dummy traces can planarize a film layer in which the fanout traces are disposed, thereby improving flatness of the third source-drain layer, improving flatness of the anode layer, and improving the display effect of the display panel.

In one embodiment, as shown in FIG. 2 to FIG. 4*n*, the OLED display panel 2 further includes a first planarization layer 253 and a second planarization layer 255. The first planarization layer 253 is disposed between the first source-drain layer 252 and the second source-drain layer 254. The second planarization layer 255 is disposed between the second source-drain layer 254 and the third source-drain layer 256. The signal traces include data lines 254*a*. The data lines 254*a* are disposed in the second source-drain layer 254. The fanout traces 31 pass through via holes 255*a* defined in the second planarization layer 255 to be connected to the data lines 254*a*. The signal traces include the data lines, the data lines are disposed in the second source-drain layer, and the fanout traces are arranged in the third source-drain layer. Thus, the fanout traces can be connected to the data lines through the via holes defined in the second planarization layer, thereby realizing signal transmission of the data lines. In addition, as the fanout traces are disposed in the display area, bezel occupied by the fanout traces is reduced, so that narrow bezel of the display panel is realized.

For a technical problem that the dummy traces that are floating may cause static electricity. In one embodiment, as shown in FIG. 2 to FIG. 4*n*, the OLED display panel 2 further includes a power signal line 254*b*. The power signal line 254*b* is disposed in the second source-drain layer 254. The dummy trace 32 passes through a via hole to be connected to the power signal line 254*b*. By connecting the dummy trace to the power signal line, circuits can be avoided from being damaged by static electricity generated by the dummy traces. In addition, the dummy traces are only connected to the power signal line, and don't affect normal operation of the circuits.

Meanwhile, a working principle and film layers structure of the OLED display panel in the embodiments of the present application are described by film layers design and circuit design of a single subpixel in the OLED display panel.

As shown in FIGS. 2 to 4*n*, and 9, FIG. 9 is a diagram of a circuit of the single subpixel in FIG. 3. The OLED display panel includes pixel driving circuits. The pixel driving circuit includes a first transistor T1, a second transistor T2, a third transistor T3, a first reset transistor T4, a first light emission control transistor T5, a second light emission control transistor T6, a second reset transistor T7, a storage capacitor Cst, a boost capacitor Cboost, a power signal line VDD, a low potential signal line VSS, a data line Data, a first scan line P Scan (n), a second scan line P Scan (n−1), a third scan line N Scan (n), a fourth scan line N Scan (n−5), and a light emission control line EM.

P Scan (n) represents a current-stage scan line, P Scan (n−1) represents a previous one-stage scan line. P Scan (n) and P Scan (n−1) are used to control P-type transistors. N Scan (n) represents a current-stage scan line, N Scan (n−5) represents a previous five-stage scan line, and these two scan lines are used to control N-type transistor.

A working principle of the circuit is as follows. In a first stage, the first reset transistor T4 and the second reset transistor T7 are turned on, a gate of the first transistor T1 is reset by a reset signal output by the first reset signal line VI-G, and a pixel light emitting unit LED is reset by a reset signal output by a second reset signal line VI-ANO. In a second stage, the second transistor T2 and the third transistor T3 are turned on, and a data signal input by the data line Data is written into the gate of the first transistor T1. In a third stage, the first light emission control transistor T5 and the second light emission control transistor T6 are turned on to drive the pixel light emitting unit LED to emit light.

Figure 2:
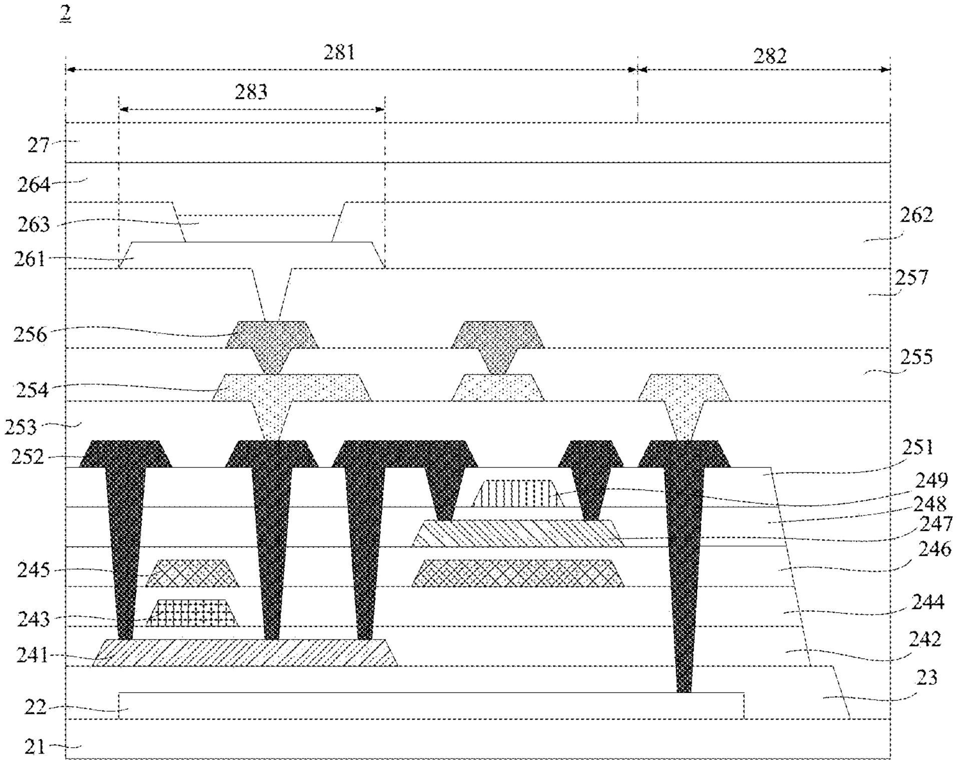
FIG. 2 is a first schematic diagram of an OLED display panel provided by embodiments of the present application.

The embodiments of the present application is described in detail by taking the diagram of circuit in FIG. 2 as an example. However, the embodiments of the present application are not limited thereto. For example, a display panel with a 7T1C (seven transistors and one capacitor) circuit can also adopt the design of the present application.

In one embodiment, as shown in FIG. 2, the OLED display panel 2 further includes a substrate 21, a light shielding layer 22, and a buffer layer 23. The light shielding layer 22 is disposed between the substrate 21 and the buffer layer 23.

In one embodiment, as shown in FIG. 2, a width of the projection of the light shielding layer 22 on the substrate 21 is greater than the maximum width between a channel region of the first semiconductor layer 241 and a channel region of the second semiconductor layer 247. The channel regions of the first semiconductor layer and the second semiconductor layer are shielded from light by the light shielding layer, so as to prevent external lights from affecting performance of the first semiconductor layer and the second semiconductor layer.

In one embodiment, as shown in FIG. 2, the light shielding layer 22 is connected to the first source-drain layer 252. The light shielding layer is connected to the first source and drain layer to reduce impedances of the first source and drain layer.

In one embodiment, as shown in FIG. 2, the OLED display panel 2 further includes the first semiconductor layer 241, a first gate insulating layer 242, a first gate layer 243, a second gate insulating layer 244, a second gate layer 245, a first interlayer insulating layer 246, the second semiconductor layer 247, a third gate insulating layer 248, a third gate layer 249, and a second interlayer insulating layer 251. Power consumption of the OLED display panel can be reduced by making the OLED display panel adopt low temperature poly-oxide (LTPO) technology.

In one embodiment, the material of the first semiconductor layer includes polysilicon, and the material of the second semiconductor layer includes metal oxide.

In one embodiment, as shown in FIG. 2, the OLED display panel 2 further includes a third planarization layer 257, an anode layer 261, a pixel definition layer 262, a luminescent material layer 263, and a cathode layer 264.

In one embodiment, as shown in FIG. 2, the OLED display panel 2 further includes an encapsulation layer 27. The encapsulation layer includes a first inorganic layer, an organic layer, and a second inorganic layer.

Specifically, FIG. 3 is a diagram of film layers of a single subpixel. Only thin film transistors are marked in FIG. 3 for ease of viewing. FIGS. 4*a* to 4*n* are exploded diagrams of each of the film layers of the single subpixel in FIG. 3. The structural designs of each film layer are described with reference to FIGS. 4*a* to 4*n*.

FIG. 4*a* shows a film layer design of the first semiconductor layer. FIG. 4*b* shows a film layer design of the first gate layer. The first gate layer 243 includes a light emission control line 243*a* and a first scanning line 243*b*. FIG. 4*c* shows a film layer design of the second gate layer. The second gate layer 245 includes a first reset signal line 245*a*, a first part 245*c* of the third scan line, and a first part 245*b* of the fourth scan line. FIG. 4*d* shows a film layer design of the second semiconductor layer. FIG. 4*e* shows a film layer design of the third gate layer. The third gate layer 249 includes a second part 249*b* of the third scan line and a second part 249*a* of the fourth scan line. FIG. 4*f* shows a design of via holes 251*a* connecting the first source-drain layer to the first semiconductor layer, that is, via holes defined in the first gate insulating layer, the second gate insulating layer, the first interlayer insulating layer, the third gate insulating layer, and the second interlayer insulating layer. FIG. 4*g* shows a design of via holes 251*b* connecting the first source-drain layer to the second semiconductor layer, that is, via holes defines in the second interlayer insulating layer and the third gate insulating layer.

FIG. 4*h* shows a film layer design of the first source-drain layer. The first source-drain layer 252 includes a second reset signal line 252*a*. FIG. 4*i* shows a design of via holes 253*a* defined in the first planarization layer. FIG. 4*j* shows a film layer design of the second source-drain layer. The second source-drain layer 254 includes a data line 254*a* and a power signal line 254*b*. FIG. 4*k* shows a design of via holes 255*a* defined in the second planarization layer. FIG. 4*l* shows a film layer design of the third source-drain layer. The third source-drain layer 256 includes the fanout traces 31 and the dummy traces 32. FIG. 4*m* shows a design of via holes 257*a* defined in the third planarization layer. FIG. 4*n* shows a film layer design of the anode layer. The anode layer 261 includes the anode 261*a*.

Figure 9:
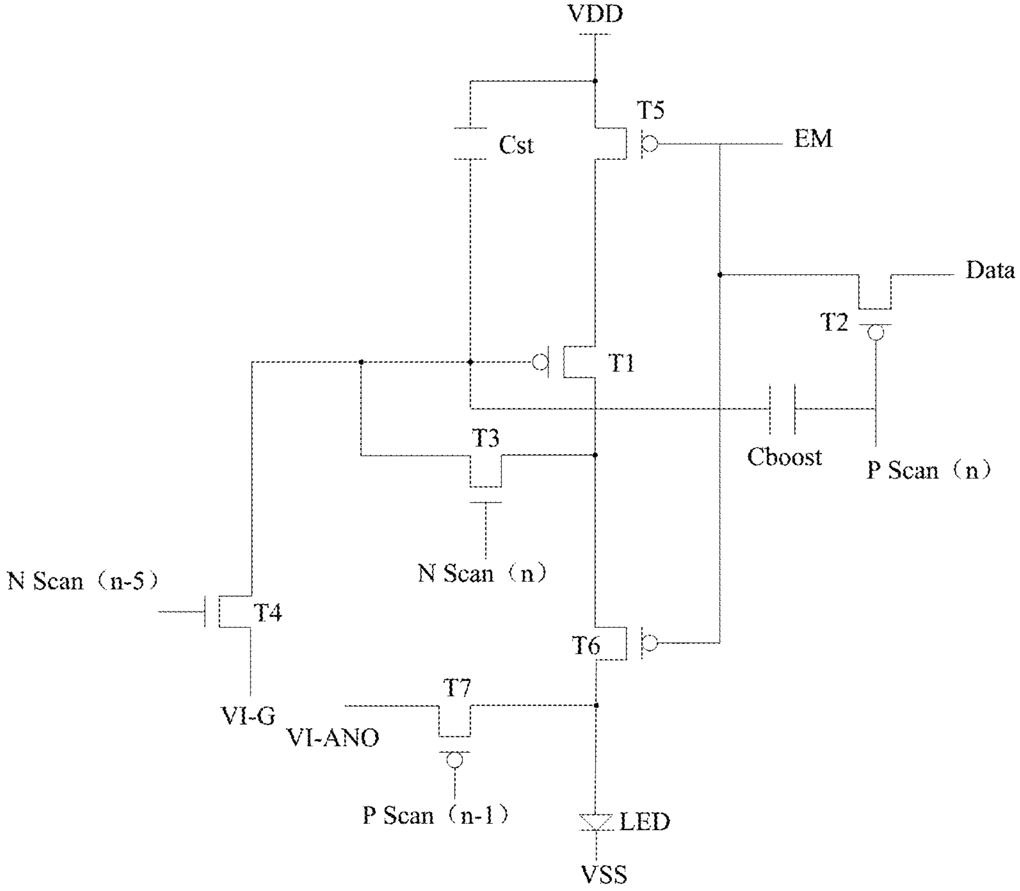
FIG. 9 is a diagram of a circuit of the single subpixel in FIG. 3.

Specifically, the design of the traces and the via holes in each film layer can be determined based on the circuit design in FIG. 9 and the film layers design in FIG. 3, which is not described again here.

It should be noted that since the traces are described by the diagram of film layers and the diagram of circuit, respectively, the traces may have different reference numerals. For example, the data line is marked with Data in the diagram of circuit, and is marked with 254*a* in the diagram of film layers. However, it is understandable that the data line marked with Data and the data line marked with 254*a* are a same data line, just because different reference numerals need to be used in the diagram of circuit and the diagram of film layers. By the same token, it can be seen that each of other traces, such as the scan lines, the reset signal line, and the light emission control lines, may use different reference numerals, which is not described again here.

Meanwhile, embodiments of the present application further provide an OLED display device including the OLED display panel of any of the above embodiments.

According to the above embodiments, it can be known that:

The present application provides an organic light emitting diode (OLED) display panel and an OLED display device. The OLED display panel includes a display area and a non-display area disposed at a side of the display area. The OLED display panel further includes signal traces and fanout traces disposed on a side of the signal traces and connected to the signal traces. The OLED display panel further includes a plurality of subpixels. Each of the subpixels includes an anode disposed on a side of the fanout traces away from the signal traces. The fanout traces extend from the non-display area to the display area. The OLED display panel further includes dummy traces disposed on a side of the anode adjacent to the signal traces. The display area includes a first area disposed corresponding to the anode. The first area is provided with at least one of the fanout traces and at least one of the dummy traces. Each of the fanout traces passing through each of the subpixels is symmetrical about a center of the anode of each of the subpixels, and each of the dummy traces passing through each of the subpixels is symmetrical about a center of the anode of each of the subpixels. In the present application, the dummy traces are disposed on the side of the anode adjacent to the signal traces, and at least one dummy trace and at least one fanout trace are correspondingly disposed at positions where the anode are disposed. Thus, the dummy traces can fill in areas where the fanout traces are not provided or compensate for areas where the fanout traces are unevenly disposed, so as to improve uniformity of traces in the display area. In addition, each of the fanout traces passing through each of the subpixels and each of the dummy traces passing through each of the subpixels are both symmetrical about a center of the anode of each of the subpixels, so as to improve flatness and symmetry of the anode, thereby improving flatness of luminescent materials. Visual effect at all viewing angles is consistent, thereby improving display defect of the display panel.

In the above embodiments, each embodiment is described with its own emphasis. For parts that are not described in detail in a certain embodiment, please refer to the relevant descriptions of other embodiments.

The OLED display panel and the OLED display device provided by the embodiments of the present application are described in detail above. Principles and implementations of the present application are described by applying specific implementations in the present application. The descriptions of the above-mentioned embodiments are only used to help understand the technical solutions and core ideas of the present application. Those of ordinary skill in the art should understand that they can still modify the technical solutions described in the foregoing embodiments, or equivalently replace some of the technical features; and these modifications or replacements do not cause the essence of the corresponding technical solutions to deviate from the scope of the technical solutions of the embodiments of the present application.

What is claimed is:

1. An organic light emitting diode (OLED) display panel, comprising a display area and a non-display area disposed at a side of the display area, wherein the OLED display panel further comprises:

signal traces; and fanout traces disposed on a side of the signal traces and connected to the signal traces;

wherein the OLED display panel further comprises a plurality of subpixels, each of the subpixels comprises an anode disposed on a side of the fanout traces away from the signal traces, and the fanout traces extend from the non-display area to the display area; wherein the OLED display panel further comprises dummy traces disposed on a side of the anode adjacent to the signal traces; and wherein the display area comprises a first area disposed corresponding to the anode, the first area is provided with at least one of the fanout traces and at least one of the dummy traces; each of the fanout traces passing through each of the subpixels is symmetrical about a center of the anode of each of the subpixels, and each of the dummy traces passing through each of the subpixels is symmetrical about a center of the anode of each of the subpixels.

2. The OLED display panel of claim 1, wherein the OLED display panel further comprises an upper bezel, a left bezel, a lower bezel, and a right bezel disposed around the display area; wherein each of the fanout traces comprises a first trace portion and a second trace portion, the first trace portion and the second trace portion are connected to each other, the first trace portion is provided along a direction from the left bezel to the right bezel, and the second trace portion is provided along a direction from the lower bezel to the upper bezel;

and wherein the display area further comprises a second area corresponding to a position where the first trace portion is disposed, a third area corresponding to a position where the second trace portion is disposed, and a fourth area where the fanout trace is not disposed.

3. The OLED display panel of claim 2, wherein at least a part of the dummy traces are disposed in the fourth area, and the dummy traces disposed in the fourth area are disconnected to the fanout traces at connection positions where the fanout traces are connected to the signal traces.

4. The OLED display panel of claim 3, wherein at least a part of the dummy traces are disposed in at least one of the second area and the third area, each of the dummy traces disposed in the second area and/or the third area is connected to a corresponding one of the fanout traces adjacent to each of the dummy traces, and each of the dummy traces is spaced from other fanout traces of the fanout traces adjacent to each of the dummy traces.

5. The OLED display panel of claim 2, wherein lengths of first trace portions decrease along the direction from the lower bezel to the upper bezel, and lengths of second trace portions increase along a direction from the left bezel to a middle area of the display area.

6. The OLED display panel of claim 5, wherein each of the dummy traces comprises a third trace portion and a fourth trace portion, the third trace portion is provided along a same direction as the first trace portion, the fourth trace portion is provided along a same direction as the second trace portion, and at least a part of third trace portions are connected to fourth trace portions; lengths of the third trace portions increase along the direction from the lower bezel to the upper bezel, and lengths of the fourth trace portions decrease along the direction from the left bezel to the middle area of the display area.

7. The OLED display panel of claim 6, wherein one of the second trace portions adjacent to each other is intersected with corresponding ones of the third trace portions, and other second trace portions of the second trace portions adjacent to each other are spaced from the corresponding ones of the third trace portions.

8. The OLED display panel according to claim 6, wherein one of the second trace portions adjacent to each other is intersected with corresponding ones of the third trace portions, and other second trace portions of the second trace portions adjacent to each other are connected to corresponding ones of other third trace portions along the direction from the left bezel to the right bezel; and the third trace portions are disconnected to each other.

9. The OLED display panel according to claim 6, wherein the dummy traces are arranged on a same layer as the fanout traces, and a unit distribution density of the dummy traces is the same as a unit distribution density of the fanout traces.

10. The OLED display panel of claim 2, wherein the subpixels comprise red subpixels, blue subpixels, and green subpixels; at least one of corresponding ones of the dummy traces passing through the red subpixels, corresponding ones of the dummy traces passing through the blue subpixels, and corresponding ones of the dummy traces passing through the green subpixels is symmetrical about a center of the anode of the corresponding one of the subpixels.

11. The OLED display panel of claim 10, wherein the red subpixels comprise first anodes, the blue subpixels comprise second anodes; each of the corresponding ones of the dummy traces passing through the red subpixels is symmetrical about a center of a corresponding one of the first anodes, and each of the corresponding ones of the dummy traces passing through the blue subpixels is symmetrical about a corresponding one of the second anodes.

12. The OLED display panel of claim 11, wherein the green subpixels comprise third anodes; each of the corresponding ones of the dummy traces passing through the green subpixels is symmetrical about a center of a corresponding one of the third anodes; and each of the corresponding ones of the dummy traces passing through the green subpixels is symmetrical about a center line of a corresponding one of the third anodes along the direction from the lower bezel to the upper bezel.

13. The OLED display panel of claim 12, wherein, along the direction from the left bezel to the right bezel, dummy traces at least partially passing through the green subpixels of adjacent columns extend into the red subpixels, and/or, dummy traces at least partially passing through the green subpixels of adjacent columns extend into the blue subpixels; and the dummy traces extending into the red subpixels and/or the blue subpixels are disconnected to the dummy traces passing through the red subpixels and the blue subpixels.

14. The OLED display panel of claim 2, wherein the OLED display panel further comprises a driving circuit layer comprising a first source-drain layer and a second source-drain layer;

the first source-drain layer comprises the signal traces, and the second source-drain layer comprises the fanout traces and the dummy traces.

15. The OLED display panel of claim 2, wherein the OLED display panel further comprises a driving circuit layer, the driving circuit layer comprises a first source-drain layer, a second source-drain layer, and a third source-drain layer; the first source-drain layer comprises a source and a drain, the second source-drain layer comprises the signal traces, and the third source-drain layer comprises the fanout traces and the dummy traces.

16. The OLED display panel of claim 15, wherein the OLED display panel further comprises a first planarization layer and a second planarization layer; the first planarization layer is disposed between the first source-drain layer and the second source-drain layer, the second planarization layer is disposed between the second source-drain layer and the third source-drain layer; the signal traces comprise data lines, and the fanout traces pass through via holes defined in the second planarization layer to be connected to the data lines.

17. The OLED display panel of claim 16, wherein the OLED display panel further comprises a power signal line, the power signal line is disposed at the second source-drain layer, and the dummy traces are connected to the power signal line through a via hole.

18. An OLED display device, comprising an OLED display panel, the OLED display panel comprising a display area and a non-display area disposed at a side of the display area, wherein the OLED display panel further comprises:

signal traces; and fanout traces disposed on a side of the signal traces and connected to the signal traces;

wherein the OLED display panel further comprises a plurality of subpixels, each of the subpixels comprises an anode disposed on a side of the fanout traces away from the signal traces, and the fanout traces extend from the non-display area to the display area; wherein the OLED display panel further comprises dummy traces disposed on a side of the anode adjacent to the signal traces; and wherein the display area comprises a first area disposed corresponding to the anode, the first area is provided with at least one of the fanout traces and at least one of the dummy traces; each of the fanout traces passing through each of the subpixels is symmetrical about a center of the anode of each of the subpixels, and each of the dummy traces passing through each of the subpixels is symmetrical about a center of the anode of each of the subpixels.

19. The OLED display device of claim 18, wherein the OLED display panel further comprises an upper bezel, a left bezel, a lower bezel, and a right bezel disposed around the display area; wherein each of the fanout traces comprises a first trace portion and a second trace portion, the first trace portion and the second trace portion are connected to each other, the first trace portion is provided along a direction from the left bezel to the right bezel, and the second trace portion is provided along a direction from the lower bezel to the upper bezel; and wherein the display area further comprises a second area corresponding to a position where the first trace portion is disposed, a third area corresponding to a position where the second trace portion is disposed, and a fourth area where the fanout trace is not disposed.

20. The OLED display device of claim 19, wherein at least a part of the dummy traces are disposed in the fourth area, and the dummy traces disposed in the fourth area are disconnected to the fanout traces at connection positions where the fanout traces are connected to the signal traces.

* * * * *